(12) United States Patent
Juds et al.

(10) Patent No.: US 9,134,351 B2
(45) Date of Patent: Sep. 15, 2015

(54) BI-DIRECTIONAL DIRECT CURRENT SENSING CIRCUIT AND CURRENT SENSING ASSEMBLY INCLUDING THE SAME

(71) Applicant: EATON CORPORATION, Cleveland, OH (US)

(72) Inventors: Mark Allan Juds, New Berlin, WI (US); James Edward Hansen, Franklin, WI (US); Jerome Kenneth Hastings, Sussex, WI (US); Dale Louis Gass, Brown Deer, WI (US); Xin Zhou, Franklin Park, PA (US)

(73) Assignee: EATON CORPORATION, Cleveland, OH (US)

( * ) Notice: Subject to any disclaimer, the term of this patent is extended or adjusted under 35 U.S.C. 154(b) by 139 days.

(21) Appl. No.: 14/102,660

(22) Filed: Dec. 11, 2013

(65) Prior Publication Data

US 2015/0160268 A1    Jun. 11, 2015

(51) Int. Cl.
| | |
|---|---|
| *G01R 33/06* | (2006.01) |
| *G01R 19/00* | (2006.01) |
| *G01R 33/07* | (2006.01) |
| *G01R 1/20* | (2006.01) |
| *G01R 1/30* | (2006.01) |

(52) U.S. Cl.
CPC ............ *G01R 19/0084* (2013.01); *G01R 1/206* (2013.01); *G01R 1/30* (2013.01); *G01R 33/07* (2013.01)

(58) Field of Classification Search
CPC ....... G01R 19/008; G01R 33/07; G01R 1/206

USPC ............ 324/248–255, 200, 378, 389, 207.21, 324/244; 702/116–117, 183, 189; 360/324, 360/324.1, 324.11, 324.12
See application file for complete search history.

(56) References Cited

U.S. PATENT DOCUMENTS

| 6,130,599 | A | 10/2000 | Juds et al. |
| 6,271,656 | B1 | 8/2001 | Juds et al. |
| 6,984,979 | B1 * | 1/2006 | Edel .............................. 324/253 |
| 7,157,898 | B2 | 1/2007 | Hastings et al. |
| 7,298,133 | B2 | 11/2007 | Hastings et al. |
| 8,922,206 | B2 * | 12/2014 | Friedrich et al. .............. 324/251 |

* cited by examiner

*Primary Examiner* — Melissa Koval
*Assistant Examiner* — Trung Nguyen
(74) *Attorney, Agent, or Firm* — Eckert Seamans Cherin & Mellott, LLC; Nathaniel C. Wilks

(57) ABSTRACT

A current sensing assembly includes a conductor, first and second magnetic sensors disposed proximate to opposite sides of the conductor and being structured to output first and second voltage signals, a current direction detector circuit structured to detect a direction of a current flowing through the conductor, a switching circuit having first and second outputs and being structured to switch between a first condition where the first voltage signal is output to the first output and the second voltage signal is output to the second output and a second condition where the first voltage signal is output to the second output and the second voltage signal is output to the first output based on the switching signal, and an output circuit including a differential amplifier structured to amplify a voltage difference between the first and second voltage signals and to output the amplified voltage difference.

17 Claims, 2 Drawing Sheets

BI-DIRECTIONAL DIRECT CURRENT SENSING CIRCUIT AND CURRENT SENSING ASSEMBLY INCLUDING THE SAME

CROSS-REFERENCE TO RELATED APPLICATION

This application is related to commonly assigned, copending U.S. patent application Ser. No. 14/102,675, filed Dec. 11, 2013, entitled "CURRENT SENSING ASSEMBLY EMPLOYING MAGNETIC SENSORS".

BACKGROUND

1. Field

The disclosed concept relates generally to current sensing and, more particularly, to circuits for sensing direct current (DC) flowing through a conductor.

2. Background Information

DC current sensing assemblies have been employed in electrical switching apparatus, such as circuit interrupters, to measure the current flowing therethrough. DC current sensing assemblies that use magnetic sensors require a corresponding circuit to amplify the output signals of the magnetic sensors. The corresponding circuit must also be able to handle both positive and negative currents through the circuit interrupter. Present designs use multiple methods for sensing positive and negative currents. Some will use one channel with a split voltage rail assigning a negative or positive sign based on voltage above or below the mid-point of the voltage range. Some will use two channels to achieve greater sensing range, higher resolution and accommodate auto ranging features.

DC current sensing assemblies should also preferably minimize errors from sensor and amplifier off-sets and temperature drift, as well as have the wide sensing range that is associated with the operating range of circuit breakers. The magnetic sensors themselves should also be low cost and very robust with a high durability.

There is room for improvement in current sensing assemblies.

There is also room for improvement in current sensing circuits.

SUMMARY

These needs and others are met by aspects of the disclosed concept which provide a current sensing assembly including a conductor, first and second magnetic sensors, a current direction detector, a switching circuit, and an output circuit. These needs and others are also met by aspects of the disclosed concept which provide a current sensing circuit including first and second magnetic sensors, a current direction detector, a switching circuit, and an output circuit.

In accordance with aspects of the disclosed concept, a current sensing assembly comprises: a conductor having a first side and a second side opposite the first side; a first magnetic sensor disposed proximate to the first side of the conductor and being structured to output a first voltage signal; a second magnetic sensor disposed proximate to the second side of the conductor and being structured to output a second voltage signal; a current direction detector circuit structured to detect a direction of a current flowing through the conductor using the first and second voltage signals and to output a switching signal based on the detected direction; a switching circuit having first and second outputs and being structured to switch between a first condition where the first voltage signal is output to the first output and the second voltage signal is output to the second output and a second condition where the first voltage signal is output to the second output and the second voltage signal is output to the first output based on the switching signal; and an output circuit structured to receive the first and second voltage signals from the first and second outputs, the output circuit including a differential amplifier structured to amplify a voltage difference between the first and second voltage signals and to output the amplified voltage difference.

In accordance with other aspects of the disclosed concept, a current sensing circuit for use with a conductor having a first side and a second side opposite the first side comprises: a first magnetic sensor configured to be disposed proximate to the first side of the conductor and being structured to output a first voltage signal; a second magnetic sensor configured to be disposed proximate to the second side of the conductor and being structured to output a second voltage signal; a current direction detector circuit structured to detect a direction of a current flowing through the conductor using the first and second voltage signals and to output a switching signal based on the detected direction; a switching circuit having first and second outputs and being structured to switch between a first condition where the first voltage signal is output to the first output and the second voltage signal is output to the second output and a second condition where the first voltage signal is output to the second output and the second voltage signal is output to the first output based on the switching signal; and an output circuit structured to receive the first and second voltage signals from the first and second outputs, the output circuit including a differential amplifier structured to amplify a voltage difference between the first and second voltage signals and to output the amplified voltage difference.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
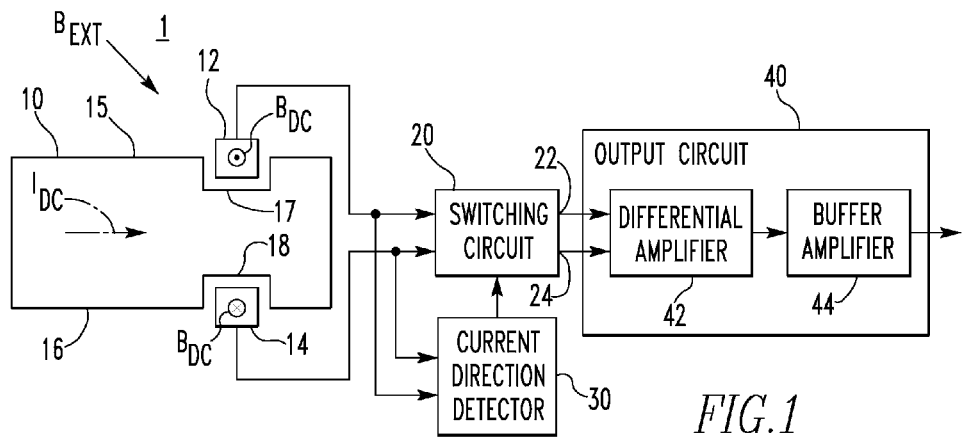
FIG. 1 is a schematic diagram in partial block form of a current sensing assembly in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "magnetic sensor" shall mean a sensor capable of measuring the amplitude of a magnetic field. One non-limiting example of a magnetic sensor is a Hall sensor.

As employed herein, the term "notch" shall mean a shaped cut in an object.

As employed herein, the term "curled" shall mean bent into an arc form having one or more radii. The arc form of a curled portion is not limited to less than 360 degrees, but rather may extend beyond 360 degrees and form multiple turns.

Referring to FIG. 1, a current sensing assembly 1 includes a conductor 10, first and second magnetic sensors 12,14, a switching circuit 20, a current direction detector 30, and an output circuit 40.

The conductor 10 has first and second sides 15,16. A first notch 17 is formed in the first side 15 of the conductor 10 and a second notch 18 is formed in the second side 16 of the conductor 10 opposite the first notch 17. The first magnetic sensor 12 is disposed proximate to the first side 15 of the conductor 10 and advantageously in the first notch 17. The second magnetic sensor 14 is disposed proximate to the second side 16 of the conductor 10 and advantageously in the second notch 18.

A current $I_{DC}$ flowing through the conductor 10 induces a magnetic field $B_{DC}$ that passes through the first and second magnetic sensors 12,14. The first and second magnetic sensors 12,14 are disposed on opposite sides of the conductor 10 and, as a result, the magnetic field $B_{DC}$ passes through the first and second magnetic sensors 12,14 in opposite directions. External magnetic fields $B_{EXT}$ also pass through the first and second magnetic sensors 12,14. External magnetic fields $B_{EXT}$ are caused by sources other than the current $I_{DC}$ flowing through the conductor 10. However, since the magnetic field $B_{DC}$ induced by the current $I_{DC}$ flowing through the conductor 10 passes through the first and second magnetic sensors 12,14 in opposite directions, the effects of the external magnetic fields $B_{EXT}$ can be substantially canceled by subtracting the outputs of the first and second magnetic sensors 12,14 from each other.

The first and second magnetic sensors 12,14 have a small sensitivity to external magnetic fields $B_{EXT}$ due to the distance between them. However, placing the first and second magnetic sensors 12,14 in the first and second notches 17,18 reduces the distance between them compared to placing them proximate to the first and second sides 17,18 of the conductor in an area where the first and second notches 17,18 are not located.

In addition to providing a location that allows the first and second magnetic sensors 12,14 to be located closer together, the first and second notches 17,18 also concentrate the current $I_{DC}$ flowing through the conductor in a smaller portion of the conductor 10. This concentration causes the magnitude of the magnetic field $B_{DC}$ passing through the first and second magnetic sensors 12,14 to be larger than would occur if the first and second notches 17,18 were not present. Additionally, the current $I_{DC}$ flowing through the conductor 10 crowds the corners of the first and second notches (i.e., the current $I_{DC}$ preferentially takes the shortest path through the conductor 12), which also results in the magnetic field $B_{DC}$ passing through the first and second magnetic sensors 12,14 to be larger than would occur if the first and second notches 17,18 were not present.

While a conductor 10 including first and second notches 17,18 is disclosed, it will also be appreciated that the disclosed concept may be adapted for use in conjunction with conductors without notches. For example and without limitation, the first and second magnetic 12,14 sensors may be disposed proximate to opposite sides of a conductor without notches without departing from the scope of the disclosed concept.

The first magnetic sensor 12 is structured to output a first voltage signal based on the magnetic field $B_{DC}$ passing through it and the second magnetic sensor 14 is structured to output a second voltage signal based on the magnetic field $B_{DC}$ passing through it. The first and second magnetic sensors 12,14 each output a neutral reference voltage (e.g., without limitation, any suitable voltage such as one half of a supply voltage; 2.5 V; 0 V) when no magnetic fields are passing through them. The magnetic field $B_{DC}$ induced by the current $I_{DC}$ flowing through the conductor 10 causes the output voltage signal of one of the first and second magnetic sensors 12,14 to increase above the neutral reference voltage in proportion to the magnitude of the magnetic field $B_{DC}$. The magnetic field $B_{DC}$ passes through the other of the first and second magnetic sensors 12,14 in the opposite direction causing the output voltage signal of the other of the first and second magnetic sensors 12,14 to decrease below the neutral reference voltage in proportion to the magnitude of the magnetic field $B_{DC}$. The direction of the current $I_{DC}$ flowing through the conductor 10 determines which one of the first and second magnetic sensors 12,14 outputs the greater output voltage signal.

The outputs of the first and second magnetic sensors 12,14 are electrically connected to both the switching circuit 20 and the current direction detector 30. The switching circuit 20 includes a first output 22 and a second output 24. The switching circuit 20 receives the first voltage signal from the first magnetic sensor 12 and outputs it to one of the first and second outputs 22,24. The switching circuit 20 also receives the second voltage signal from the second magnetic sensor 14 and outputs it to the other of the first and second outputs 22,24. The switching circuit 20 is configured to switch between first and second conditions based on a switching signal output from the current direction detector 30. When the switching circuit 20 is in a first condition, it outputs the first voltage signal to the first output 22 and the second voltage signal to the second output 24, and when the switching circuit 20 is in a second condition, it outputs the second voltage signal to the first output 22 and the first voltage signal to the second output 24.

The current direction detector 30 uses the first and second voltage signals to determine the direction of the current $I_{DC}$ flowing through the conductor. In more detail, the current direction detector 30 determines the direction of the current $I_{DC}$ flowing through the conductor 10 based on which one of the first and second voltage signals output by the first and second magnetic sensors 12,14 is greater. The current direction detector 30 then outputs the switching signal to the switching circuit 20 based on the detected direction to control the condition of the switching circuit 20.

In the example embodiment of the disclosed concept shown in FIG. 1, the current direction detector 30 is structured to control the switching circuit 20 to be in the first condition when the first voltage signal is greater than the second voltage signal and to be in the second condition when the second voltage signal is greater than the first voltage signal. Thus, the switching circuit 20 will output the greater of the first and second voltage signals to the first output 22 and the lesser of the first and second voltage signals to the second output 24.

The switching signal may include a first switching signal and a second switching signal that has a different state than the first switching signal. In more detail, when the first switching signal has a first state (e.g., without limitation, a logic high), the second switching signal has a second state (e.g., without limitation, a logic low), and when the first switching signal has the first state, the second switching signal has the second state. Using first and second switching signals having different states is particularly useful when the switching circuit 20 uses pairs of switches (see e.g., FIG. 4).

The output circuit 40 is electrically connected to the first and second outputs 22,24 of the switching circuit 20. The output circuit 40 includes a differential amplifier 42 and a buffer amplifier 44.

The differential amplifier 42 is structured to receive the first and second voltage signals from the first and second outputs 22,24. The differential amplifier 42 is also structured to amplify the voltage difference between the first and second voltage signals and to output the amplified voltage difference. Since the first and second voltage signals "float" at a nominal offset level above ground potential, the difference between these signals is pertinent to determining the current $I_{DC}$ while their individual levels above ground potential is not. The amplified voltage difference output by the differential amplifier 42 has a voltage with respect to ground potential that corresponds to the level of the current $I_{DC}$. Most processing circuitry operates with ground referenced signals, so it is important to convert the first and second voltage signals, which are not ground referenced signals, to the amplified voltage difference, which is a ground referenced signal.

As previously described, the switching circuit 20 will output the greater of the first and second voltage signals to the first output 22 and the lesser of the first and second voltage signals to the second output 24. The differential amplifier 42 is oriented such that it subtracts the lesser of the lesser of the first and second voltage signals (the second output 24) from the greater of the first and second voltage signals (the first output 22), thus ensuring that the amplified voltage difference always has a positive value regardless of the direction of the current $I_{DC}$.

The same differential amplifier 42 is used regardless of the direction of the current $I_{DC}$. This increases the symmetry of the current sensing assembly 1 compared with designs that use different amplifiers stages for different current directions.

The buffer amplifier 44 receives the amplified voltage difference from the differential amplifier 42. The buffer amplifier 44 further amplifies the amplified voltage difference. The buffer amplifier 44 also serves as a buffer between the current sensing assembly 1 and other circuit components. It should be appreciated that the buffer amplifier 44 may be omitted without departing from the scope of the disclosed concept.

It is contemplated that the buffer amplifier 44 may provide scaling and/or level shifting functions. It is contemplated that the buffer amplifier 44 can be used to match the output level range of the output circuit 40 to match that used by subsequent circuitry, such as, for example and without limitation, control and trip function circuitry in a circuit breaker. It is further contemplated that the buffer amplifier 44 may be powered by a separate supply voltage which would allow it to further amplify the amplified voltage difference beyond levels available from other components of the current sensing assembly 1.

The output of the current sensing assembly 1 is a voltage signal that is proportional to the magnitude of the current $I_{DC}$ flowing through the conductor 10, regardless which direction the current $I_{DC}$ is flowing.

Figure 2:
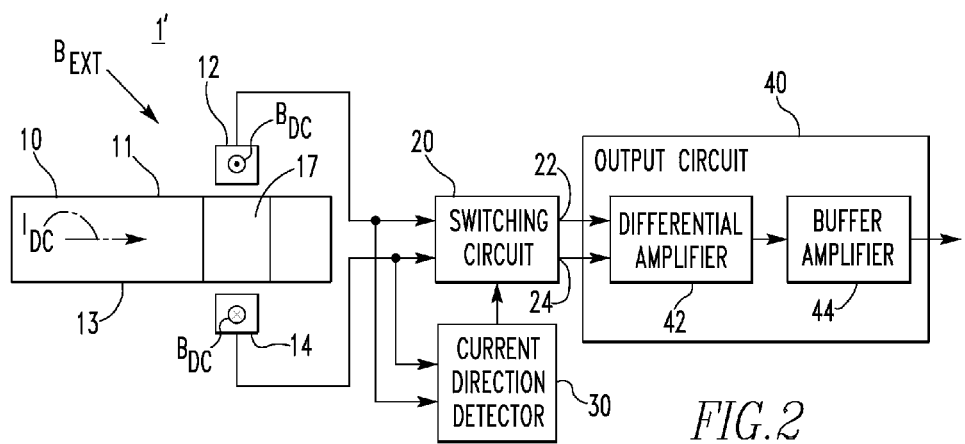
FIG. 2 is a schematic diagram in partial block form of a current sensing assembly in accordance with another example embodiment of the disclosed concept.

Referring to FIG. 2, a current sensing assembly 1' in accordance with another example embodiment of the disclosed concept includes the same components as the current sensing assembly 1 of FIG. 1. Therefore, further description of the components is omitted. However, in the current sensing assembly 1' of FIG. 2, the first magnetic sensor 12 is disposed proximate to a third side 11 of the conductor 10 between the first notch 17 and the second notches (the second notch is not shown in FIG. 2, but is disposed opposite the first notch 17 as shown in FIG. 1). The second magnetic sensor 14 is disposed proximate to a fourth side 13 of the conductor 10 opposite the third side 11 of the conductor 10. The second magnetic sensor 14 is also disposed between the first and second notches 17,18.

Figure 3:
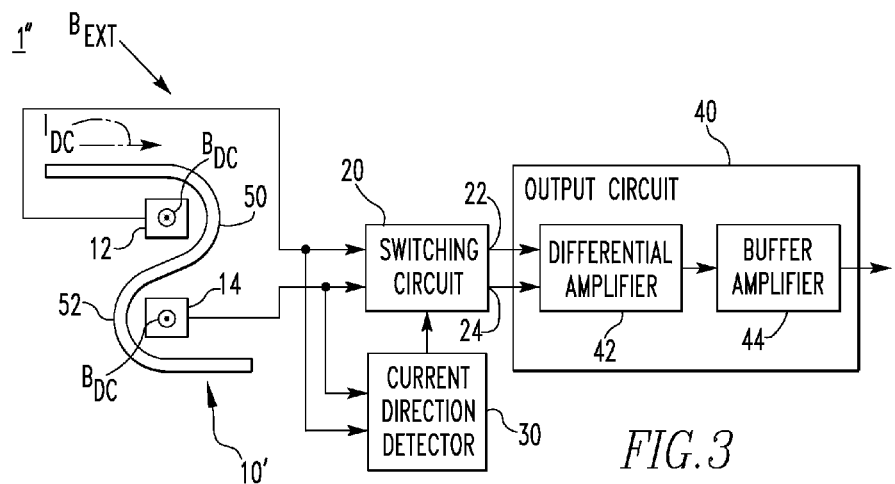
FIG. 3 is a schematic diagram in partial block form of a current sensing assembly in accordance with another example embodiment of the disclosed concept.

Referring to FIG. 3, a current sensing assembly 1" in accordance with another example embodiment of the disclosed concept includes the same first and second magnetic sensors 12,14, switching circuit 20, current direction detector 30, and output circuit 40 as the current sensing assembly 1 of FIG. 1. Therefore, further description of these components is omitted. However, the current sensing assembly 1" of FIG. 3 includes a conductor 10' that includes a first curled portion 50 and a second curled portion 52.

The first magnetic sensor 12 is disposed in the first curled portion 50 of the conductor 10' and the second magnetic sensor 14 is disposed on the opposite side of the conductor 10' and in the second curled portion 52 of the conductor 10'. The magnetic field $B_{DC}$ induced by the current $I_{DC}$ flowing through the conductor 10' passes through the first and second magnetic sensors 12,14 in opposite directions. The first and second curled portions 50,52 of the conductor 10' advantageously concentrate the magnetic field BD, that passes through the first and second magnetic sensors 12,14 which increases its magnitude.

While the first and second curled portions 50,52 disclosed in the current sensing assembly 1" of FIG. 3 have an arc length of about 180 degrees, the disclosed concept is not limited thereto. It is contemplated that the first and second curled portions 50,52 may have any suitable arc length without departing from the scope of the disclosed concept. It is also contemplated that the first and second curled portions 50,52 may each form one or more turns without departing from the scope of the disclosed concept.

Figure 4:
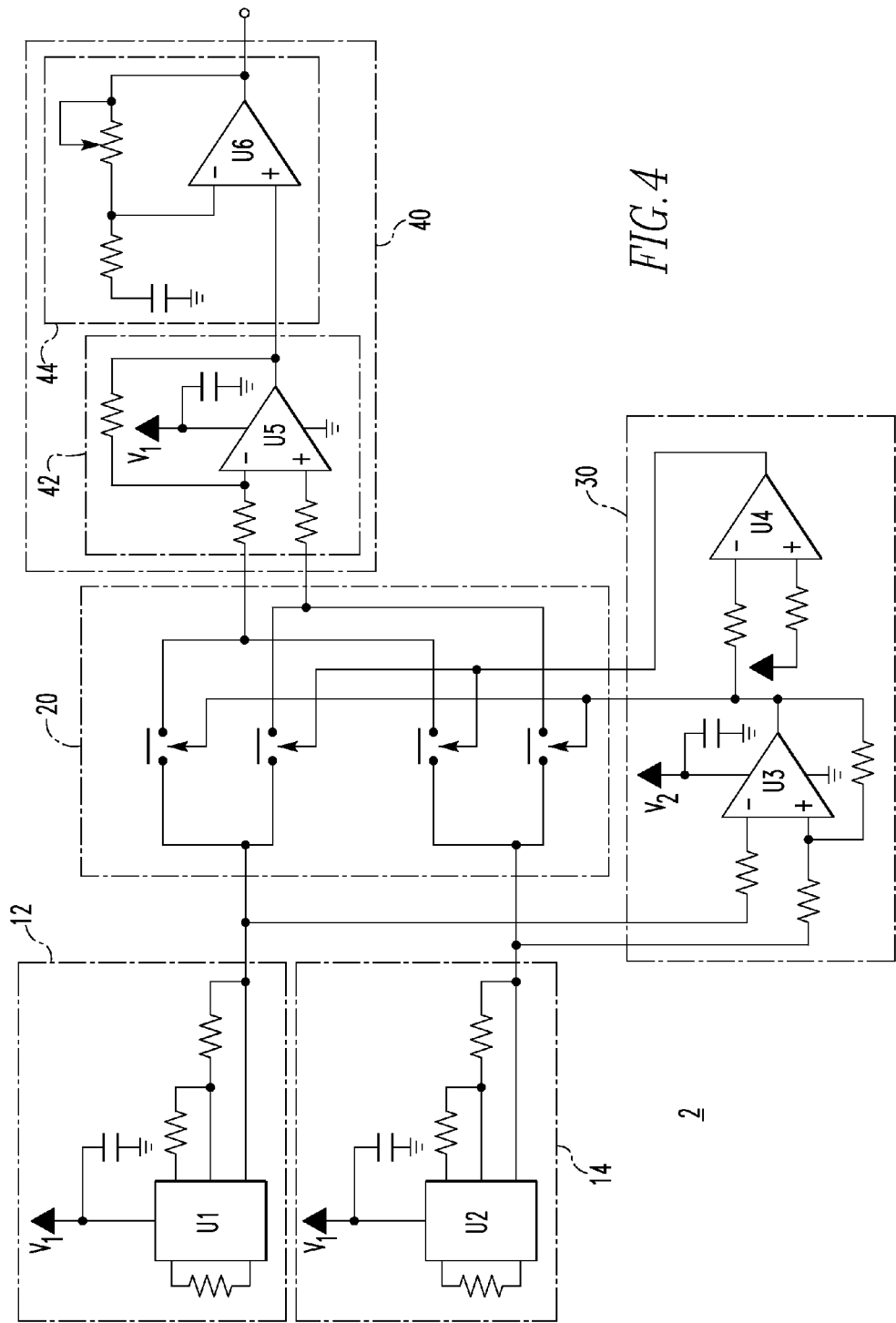
FIG. 4 is a circuit diagram of a current sensing circuit in accordance with an example embodiment of the disclosed concept.

FIG. 4 is a circuit diagram of an example current sensing circuit 2 suitable for use in the current sensing assemblies of FIGS. 1-3. The current sensing circuit 2 includes the first and second magnetic sensors 12,14, the switching circuit 20, the current direction detector 30, and the output circuit 40.

The first and second magnetic sensors 12,14 respectively include integrated circuits U1,U2 having Hall effect elements. The first and second magnetic sensors 12,14 output first and second voltage signals, respectively. The current direction detector 30 includes a first operational amplifier U3 that is connected as a differential comparator that outputs the first switching signal having the first state. The current direction detector 30 also includes a second operational amplifier U4 also connected as a differential comparator that outputs the second switching signal having the opposite second state. The first and second switching signals electrically control four switches included in the switching circuit 20.

While a particular configuration of circuit elements is disclosed in the current sensing circuit 2 of FIG. 4, it will be appreciated by those having ordinary skill in the art that the disclosed concept is not limited thereto. It will be appreciated that substitutions, modifications, and other obvious adaptations of the circuit elements or configuration of circuit elements in the current sensing circuit 2 may be employed without departing from the scope of the disclosed concept.

It is contemplated that the first and second magnetic sensors 12,14 may be trimmed to an optimized field sensing gain factor to provide a desired output excursion over the specific magnetic flux (i.e., current) range for the particular application to ensure optimal resolution.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A current sensing assembly comprising:
   a conductor having a first side and a second side opposite the first side;
   a first magnetic sensor disposed proximate to the first side of the conductor and being structured to output a first voltage signal;
   a second magnetic sensor disposed proximate to the second side of the conductor and being structured to output a second voltage signal;
   a current direction detector circuit structured to detect a direction of a current flowing through the conductor using the first and second voltage signals and to output a switching signal based on the detected direction;
   a switching circuit having first and second outputs and being structured to switch between a first condition where the first voltage signal is output to the first output and the second voltage signal is output to the second output and a second condition where the first voltage signal is output to the second output and the second voltage signal is output to the first output based on the switching signal; and
   an output circuit structured to receive the first and second voltage signals from the first and second outputs, the output circuit including a differential amplifier structured to amplify a voltage difference between the first and second voltage signals and to output the amplified voltage difference.

2. The current sensing assembly of claim 1, wherein a first notch is formed in the first side of the conductor and a second notch is formed in the second side of the conductor opposite the first notch; and wherein the first magnetic sensor is disposed in the first notch and the second magnetic sensor is disposed in the second notch.

3. The current sensing assembly of claim 1, wherein the conductor further includes a third side and a fourth side opposite the third side; and wherein a first notch is formed in the third side of the conductor and a second notch is formed in the fourth side of the conductor opposite the first notch; and wherein the first and second magnetic sensors are disposed between the first and second notches.

4. The current sensing assembly of claim 1, wherein the conductor further includes a first curled portion and a second curled portion; and wherein the first magnetic sensor is disposed in the first curled portion and the second magnetic sensor is disposed in the second curled portion.

5. The current sensing assembly of claim 1, wherein the first and second magnetic sensors are Hall sensors.

6. The current sensing assembly of claim 1, wherein when the current flows in a first direction through the conductor, the first voltage signal is greater than the second voltage signal; and wherein when the current flows in a second direction through the conductor opposite the first direction, the second voltage signal is greater than the first voltage signal.

7. The current sensing assembly of claim 6, wherein the current direction detector is structured to compare the first voltage signal and the second voltage signal; and wherein the current direction detector is further structured to detect the direction of the current flowing through the conductor based on which of the first and second voltage signals is greater.

8. The current sensing assembly of claim 1, wherein the switching signal includes a first switching signal and a second switching signal; wherein when the first switching signal is a first state the second switching signal is a second state different than the first state; and wherein when the first switching signal is the second state the second switching signal is the first state.

9. The current sensing assembly of claim 8, wherein the switching circuit is structured to output the first voltage signal to the first output when the first switching signal is the first state and to output the first voltage signal to the second output when the first switching signal is the second state; and wherein the switching circuit is further structured to output the second voltage signal to the first output when the second switching signal is the first state and to output the second voltage signal to the second output when the second switching signal is the second state.

10. The current sensing assembly of claim 1, wherein the output circuit further includes a buffer amplifier structured to receive the amplified voltage difference from the differential amplifier and to further amplify the amplified voltage difference.

11. A current sensing circuit for use with a conductor having a first side and a second side opposite the first side, the current sensing circuit comprising:
    a first magnetic sensor configured to be disposed proximate to the first side of the conductor and being structured to output a first voltage signal;
    a second magnetic sensor configured to be disposed proximate to the second side of the conductor and being structured to output a second voltage signal;
    a current direction detector circuit structured to detect a direction of a current flowing through the conductor using the first and second voltage signals and to output a switching signal based on the detected direction;
    a switching circuit having first and second outputs and being structured to switch between a first condition where the first voltage signal is output to the first output and the second voltage signal is output to the second output and a second condition where the first voltage signal is output to the second output and the second voltage signal is output to the first output based on the switching signal; and
    an output circuit structured to receive the first and second voltage signals from the first and second outputs, the output circuit including a differential amplifier structured to amplify a voltage difference between the first and second voltage signals and to output the amplified voltage difference.

12. The current sensing circuit of claim 11, wherein the first and second magnetic sensors are Hall sensors.

13. The current sensing circuit of claim 11, wherein when the current flows in a first direction through the conductor, the first voltage signal is greater than the second voltage signal; and wherein when the current flows in a second direction through the conductor opposite the first direction, the second voltage signal is greater than the first voltage signal.

14. The current sensing circuit of claim 13, wherein the current direction detector is structured to compare the first voltage signal and the second voltage signal; and wherein the current direction detector is further structured to detect the direction of the current flowing through the conductor based on which of the first and second voltage signals is greater.

15. The current sensing circuit of claim 11, wherein the switching signal includes a first switching signal and a second switching signal; wherein when the first switching signal is a first state the second switching signal is a second state different than the first state; and wherein when the first switching signal is the second state the second switching signal is the first state.

16. The current sensing circuit of claim 15, wherein the switching circuit is structured to output the first voltage signal to the first output when the first switching signal is the first state and to output the first voltage signal to the second output when the first switching signal is the second state; and wherein the switching circuit is structured to output the second voltage signal to the first output when the second switching signal is the first state and to output the second voltage signal to the second output when the second switching signal is the second state.

17. The current sensing circuit of claim 11, wherein the output circuit further includes a buffer amplifier structured to receive the amplified voltage difference from the differential amplifier and to further amplify the amplified voltage difference.

* * * * *